(12) United States Patent
Sugihara

(10) Patent No.: US 11,751,371 B2
(45) Date of Patent: Sep. 5, 2023

(54) COMPONENT MOUNTING DEVICE

(71) Applicant: FUJI CORPORATION, Chiryu (JP)

(72) Inventor: Kohei Sugihara, Nishio (JP)

(73) Assignee: FUJI CORPORATION, Chiryu (JP)

(*) Notice: Subject to any disclaimer, the term of this patent is extended or adjusted under 35 U.S.C. 154(b) by 245 days.

(21) Appl. No.: 17/419,962

(22) PCT Filed: Jan. 18, 2019

(86) PCT No.: PCT/JP2019/001520
§ 371 (c)(1),
(2) Date: Jun. 30, 2021

(87) PCT Pub. No.: WO2020/148901
PCT Pub. Date: Jul. 23, 2020

(65) Prior Publication Data
US 2022/0087086 A1    Mar. 17, 2022

(51) Int. Cl.
*H05K 13/08*    (2006.01)
*H05K 13/04*    (2006.01)

(52) U.S. Cl.
CPC ..... *H05K 13/0813* (2018.08); *H05K 13/0419* (2018.08); *H05K 13/0452* (2013.01);
(Continued)

(58) Field of Classification Search
CPC ............. H05K 13/022; H05K 13/0417; H05K 13/0419; H05K 13/0452; H05K 13/081; H05K 13/0812; H05K 13/0813; H05K 13/0818; H05K 13/083; H05K 13/086; H05K 13/0882; Y10T 29/4913;
(Continued)

(56) References Cited

U.S. PATENT DOCUMENTS

2017/0196131 A1*  7/2017  Ishikawa ................ H05K 13/08
2018/0177088 A1*  6/2018  Goto ..................... H05K 13/089

FOREIGN PATENT DOCUMENTS

| JP | 2007-95764 A   | 4/2007 |
| JP | 2009-117624 A  | 5/2009 |
| JP | 2015-144167 A  | 8/2015 |

OTHER PUBLICATIONS

International Search Report dated Mar. 19, 2019 in PCT/JP2019/001520 filed on Jan. 18, 2019 (citing references AP and AQ therein, 1 page).

* cited by examiner

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A component mounting device includes a control device configured to execute a recognition data creation process and a pickup process. In the recognition data creation process, the control device creates the recognition data by obtaining the angle information of the component, causing the imaging device to operate so as to image the component, and rotating the captured image so obtained to the reference angle based on the angle information. In the pickup process, the control device causes the head to operate so as to pick up the component after the supply state of the component is determined based on the captured image obtained by causing the imaging device to operate so as to image the component, the recognition data created in the recognition data creation process, and the angle information.

5 Claims, 7 Drawing Sheets

(52) U.S. Cl.
CPC ....... *H05K 13/086* (2018.08); *H05K 13/0812* (2018.08); *H05K 13/0882* (2018.08); *Y10T 29/49131* (2015.01); *Y10T 29/53174* (2015.01)

(58) Field of Classification Search
CPC ......... Y10T 29/49131; Y10T 29/53174; Y10T 29/53178
See application file for complete search history.

(a)

(b)

(c)

COMPONENT MOUNTING DEVICE

TECHNICAL FIELD

The present description discloses a component mounting device for picking up a component supplied from a component supply device and mounting the component so picked up onto a target object.

BACKGROUND ART

Conventionally, as a component mounting device of this type, there has been proposed a component mounting device for mounting an electronic component onto a board in which image recognition data is created in advance, a board is imaged by a camera in a state with a component mounted thereon, and image data so captured is put in a recognition process in which the captured image data is recognized by use of the image recognition data (for example, refer to Patent Literature 1). A control device of this component mounting device creates in advance an image capture frame (a reference image capture frame) in such a state that the direction of a component is aligned with a reference direction as image recognition data. In performing the recognition process, the control device rotates the reference image capture frame by a regulated offset angle associated with a component that constitutes a recognition target to thereby create a post-rotation image capture frame for performing a recognition. Then, the control device inspects the mounting state of the component on the board by performing the recognition process on the recognition image, being obtained by imaging the board by the camera in such a state that the component is mounted on the board, by use of the post-rotation image capture frame and the regulated offset angle.

PATENT LITERATURE

Patent Literature 1: JP-A-2007-95764

BRIEF SUMMARY

Technical Problem

With the component mounting device described above in which a component is mounted on a board while being offset in the rotational direction, although the creation of image recognition data for inspection of the mounting state of a component is described, the creation of recognition data for determination on a supply state of a component that is supplied from a component supply device is not taken into consideration at all.

A principal object of the present disclosure is to create recognition data for determination on a supply state of a component that is supplied from a component supply device through a simple process.

Solution to Problem

The present disclosure adopts a means that will be described below to achieve the principal object described above.

According to the gist of the present disclosure, there is provided a component mounting device for picking up a component supplied from a component supply device and mounting the component so picked up onto a target object, including:

a head configured to pick up the component;

an imaging device configured to image the component supplied from the component supply device; and a control device configured to execute a recognition data creation process for preparing the recognition data by obtaining angle information on a supply angle of the component supplied from the component supply device with respect to a reference angle thereof, causing the imaging device to operate so as to image the component supplied from the component supply device, and rotating a captured image so obtained to the reference angle based on the angle information, and a pickup process for causing the head to operate so as to pick up the component after a supply state of the component is determined based on the captured image obtained by causing the imaging device to operate so as to image the component supplied from the component supply device, the recognition data created in the recognition data creation process, and the angle information.

The component mounting device of the present disclosure includes the control device configured to execute the recognition data creation process and the pickup process. In the recognition data creation process, the control device creates the recognition data by obtaining the angle information of the component, causing the imaging device to operate so as to image the component, and rotating the captured image so obtained to the reference angle based on the angle information. In the pickup process, the control device causes the head to operate so as to pick up the component after the supply state of the component is determined based on the captured image obtained by causing the imaging device to operate so as to image the component, the recognition data created in the recognition data creation process, and the angle information. In this way, the component mounting device can create the recognition data by sharing the part of the process executed in the recognition data creation process with the pickup process. As a result, with the component mounting device, the recognition data for determining on the supply state of the component supplied from the component supply device can be created through the simple process.

DESCRIPTION OF EMBODIMENTS

Figure 1:
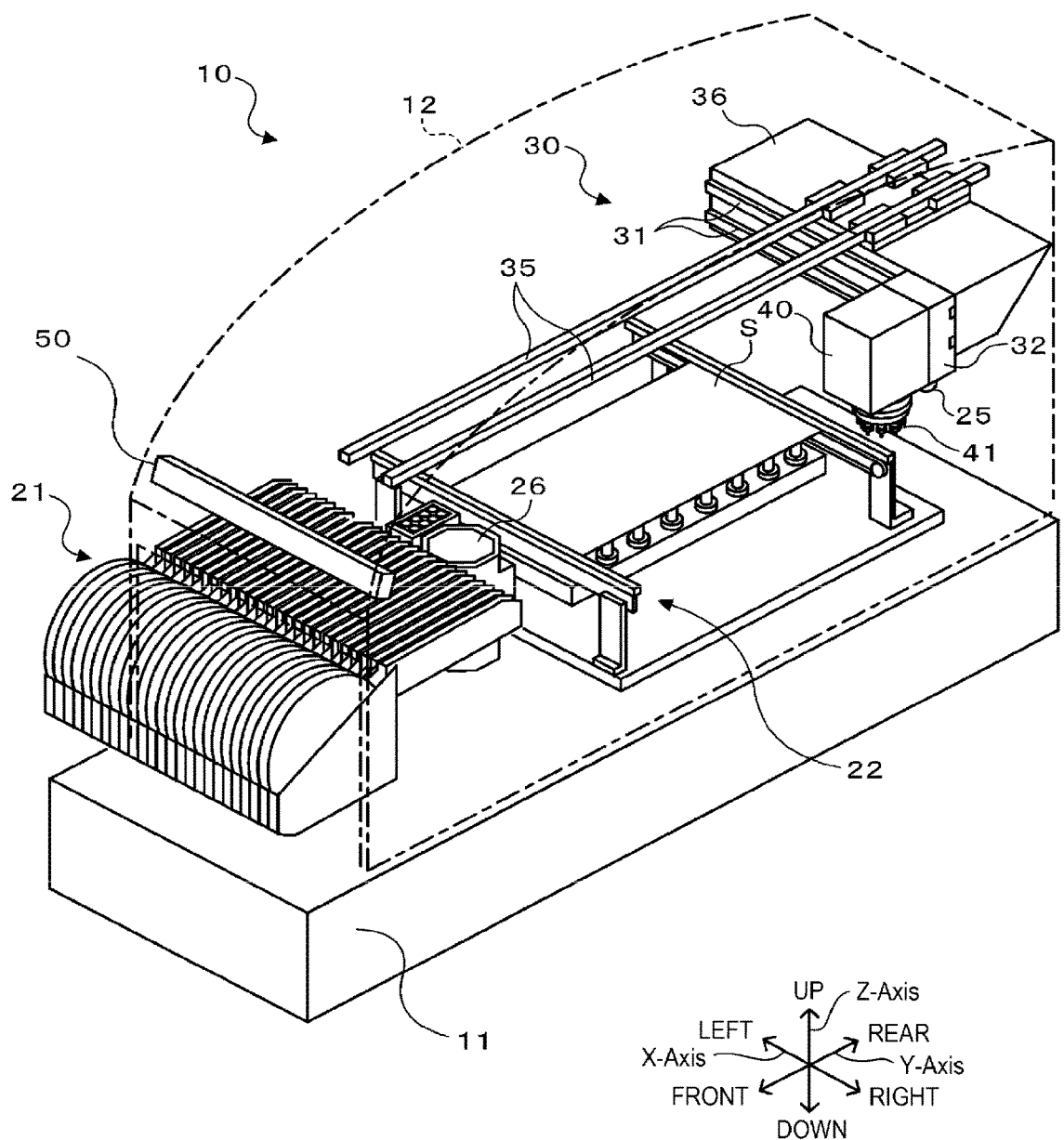
FIG. 1 is a schematic configuration view of component mounting device 10.
Figure 2:
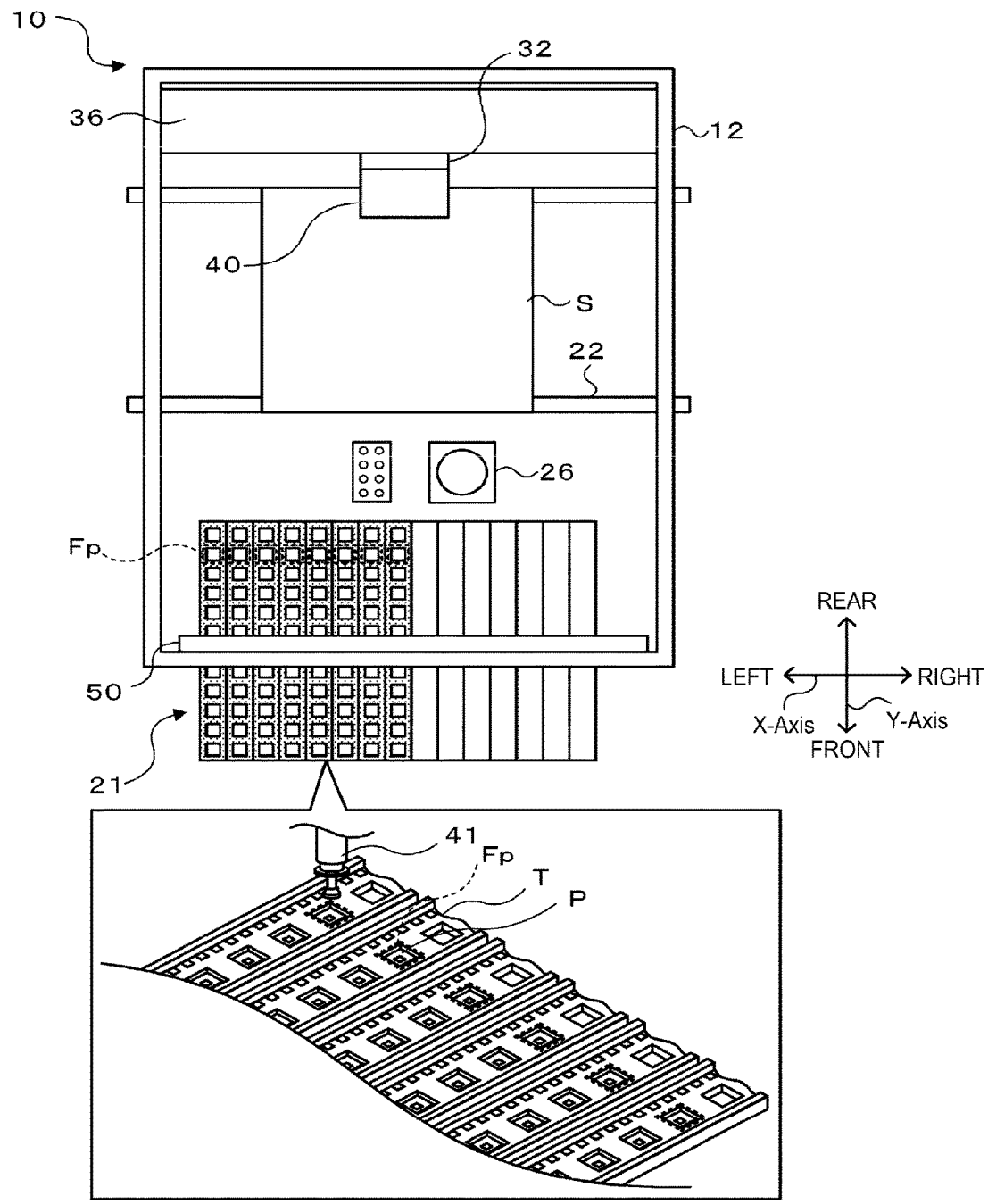
FIG. 2 is a top view of component mounting device 10.
Figure 3:
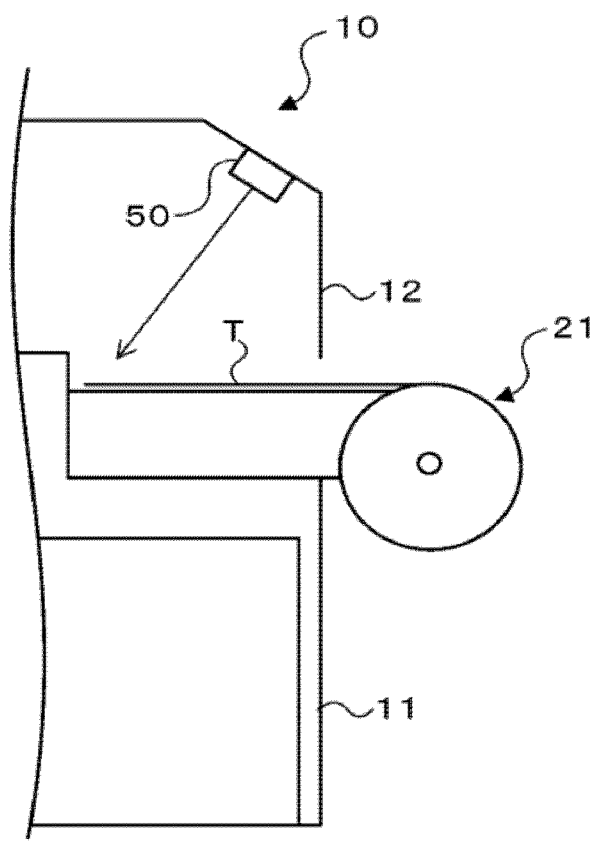
FIG. 3 is a partial side view of component mounting device 10.
Figure 4:
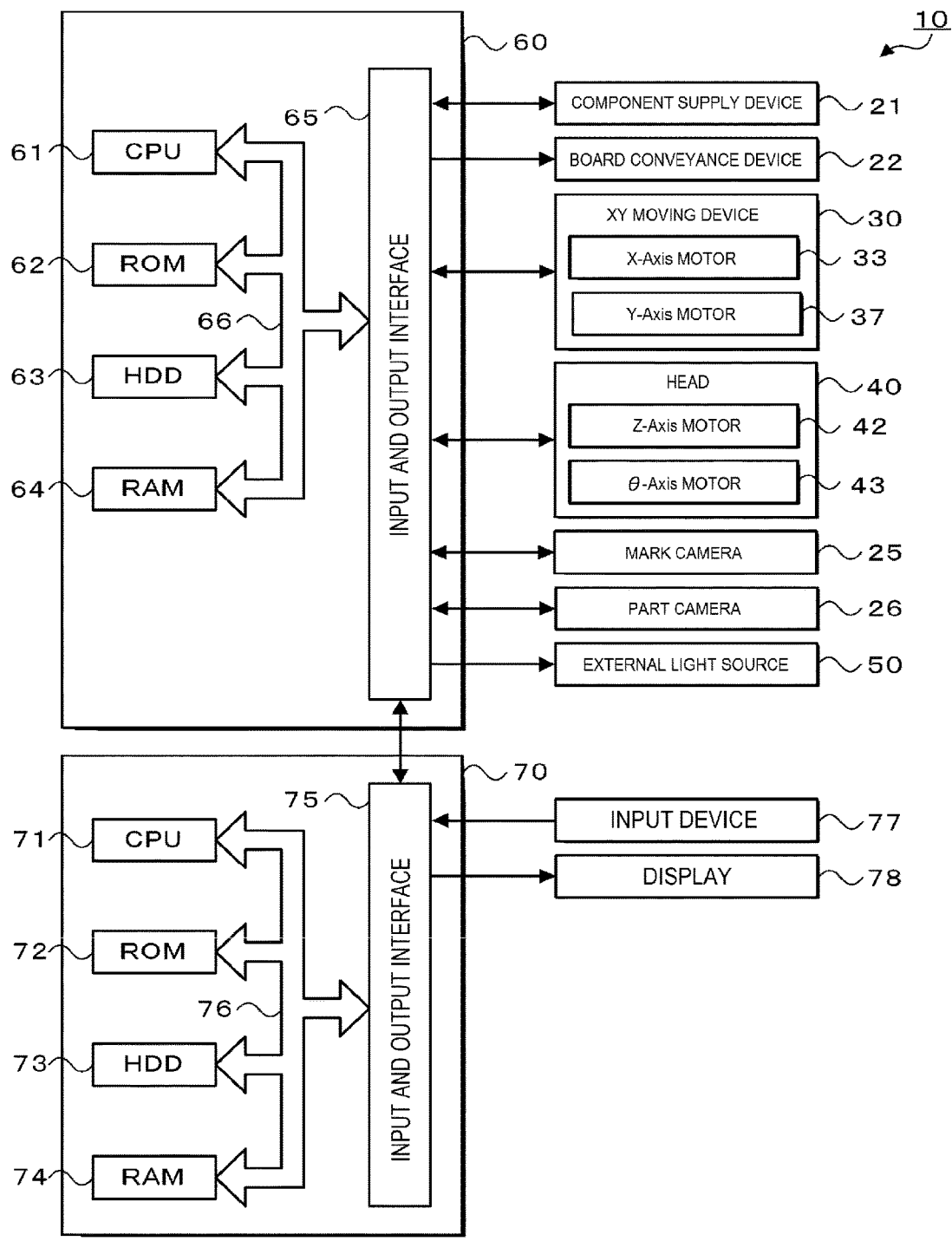
FIG. 4 is a block diagram showing electrical connection relationships in component mounting device 10.

FIG. 1 is a schematic configuration view of component mounting device 10. FIG. 2 is a top view of component mounting device 10. FIG. 3 is a partial side view of component mounting device 10. FIG. 4 is a block diagram showing electrical connection relationships in component mounting device 10. In FIG. 1, a left-right direction constitutes an X-axis direction, a front-rear direction constitutes a Y-axis direction, and an up-down direction constitutes a Z-axis direction.

As shown in FIGS. 1 to 4, component mounting device 10 includes component supply device 21, board conveyance device 22, XY moving device 30, head 40, external light source 50, and control device 60. These are disposed within housing 12 supported on base 11. Multiple component mounting devices 10 are disposed in a board conveyance direction to thereby make up a component mounting line. The component mounting line is managed by management device 70.

Component supply device 21 is configured as a tape feeder including a reel and is detachably attached to a feeder table provided at a front side of base 11. Tape T is wound around each reel, and multiple components are held onto tape T at equal intervals along a longitudinal direction of tape T. This tape T is unwound from the reel towards the rear and is then fed out to component supply position Fp (refer to FIG. 2) with components P exposed thereon. Component P supplied to component supply position Fp is collected (picked up) by suction nozzle 41 of head 40. Although not shown, component supply device 21 may include a tray unit for feeding out a tray on which multiple components are placed in an aligned state, or may include a wafer supply unit for supplying a wafer affixed to a dicing sheet and divided into multiple dies.

Board conveyance device 22 is configured to convey in, fix, and convey out board S in the left-right direction (the X-axis direction). Board conveyance device 22 has a pair of conveyor belts which are provided in such a manner as to be spaced apart so as to define a space therebetween in the front-rear direction and are each stretched in the left-right direction as seen in FIG. 1. Board S is conveyed by these conveyor belts.

XY moving device 30 moves head 40 on an XY-plane which follows a front surface of board S. As shown in FIG. 1, this XY moving device 30 includes X-axis slider 32 and Y-axis slider 36. X-axis slider 32 is supported by pair of upper and lower X-axis guide rails 31 provided on a front face of Y-axis slider 36 in such a manner as to extend in the left-right direction. X-axis slider 32 can move in the left-right direction, that is, the X-axis direction by driving X-axis motor 33 (refer to FIG. 4). Y-axis slider 36 is supported by pair of left and right Y-axis guide rails 35 that is provided at an upper portion of housing 12 in such a manner as to extend in the front-rear direction. Y-axis slider 36 can move in the front-rear direction, that is, the Y-axis direction by driving Y-axis motor 37 (refer to FIG. 4). Head 40 is attached to X-axis slider 32. Accordingly, head 40 can be moved in XY-directions by XY moving device 30.

Head 40 collects (picks up) component P supplied from component supply device 21 to component supply position Fp and mounts that component P onto board S that is fixed to board conveyance device 22. Head 40 is configured as, for example, a rotary head having multiple holders that are arranged on an identical circumference. Suction nozzle 41 is detachably attached to a distal end portion of each of the holders. Head 40 includes Z-axis motor 42 (refer to FIG. 4) configured to lift up and lower the holder, θ-axis motor 43 (refer to FIG. 4) configured to rotate the holder on its own axis, and the like. Suction nozzle 41 picks up component P by means of a negative pressure supplied by a pressure supply device (not shown) and releases component P picked up thereby and held thereto by means of a positive pressure supplied by the pressure supply device. Although not shown, the pressure supply device is configured to include a negative pressure source, a positive pressure source, and a selector valve that can switch pressures to be supplied to a pickup port of each suction nozzle 41 among a negative pressure, a positive pressure, and the atmospheric pressure.

Mark camera 25 images an upper surface of board S that is conveyed by board conveyance device 22 from above or images an upper surface of component P that is supplied by component supply device 21 from above. Mark camera 25 is provided on head 40 or X-axis slider 32 and can be caused to move in the XY-directions by XY moving device 30. This mark camera 25 captures an image of a reference mark that is affixed to board S so as to be used in obtaining a position of board S and outputs the image of the reference mark so captured to control device 60. In addition, mark camera 25 captures an image of an upper surface of component P and outputs the image of that component P so captured to control device 60.

Part camera 26 is disposed between board conveyance device 22 and component supply device 21 which are both supported on base 11. Part camera 26 captures an image of a component that is picked up by and held onto suction nozzle 41 from below when that suction nozzle 41 passes over part camera 26 and outputs the image of the component so captured to control device 60.

As shown in FIGS. 1 to 3, external light source 50 is attached to a front inner wall of housing 12. External light source 50 is made up of, for example, an LED light and is configured to compensate for an insufficient amount of light by emitting light towards component P that is supplied by component supply device 21 when capturing an image of that component P by use of mark camera 25.

As shown in FIG. 4, control device 60 is configured as a microprocessor that is made up mainly of CPU 61 and includes ROM 62 for storing process programs, HDD 63 as an external storage device for storing various types of data, RAM 64 used as a work region, input and output interface 65 for exchanging electric signals with external devices, and the like. These are connected to one another via bus 66. An SSD may be used as the external storage device in place of HDD 63. Control device 60 outputs control signals to component supply device 21, board conveyance device 22, head 40 (Z-axis motor 42 and θ-axis motor 43), mark camera 25, part camera 26, and external light source 50. In addition, control device 60 receives as inputs signals from head 40, component supply device 21, mark camera 25, and part camera 26.

Management device 70 is configured as a computer for managing information on each component mounting device 10 that makes up the component mounting line. Management device 70 is configured as a microprocessor that is made up mainly of CPU 71 and includes ROM 72 for storing process programs, HDD 73 for storing various types of data, RAM 74 used as a work region, input and output interface 75 for exchanging electric signals with external devices, and the like. These are connected to one another via bus 76. Input device 77 such as a keyboard, a mouse and the like with which an operator inputs various types of commands and display 78 for displaying various types of information thereon are connected to management device 70. An SSD may be used as the external storage device in place of HDD 73. HDD 73 stores job information including a production program and other production information. Here, the production program means a program that determines which component is to be mounted on which board S in which order and how many boards with such components so mounted are to be produced in component mounting device 10. In addition, the production information includes component information on mounting target component P, board information on board S on which component P is mounted, head information on head 40 that is used, nozzle information on suction nozzle 41 that is used, target mounting position Mp where to mount mounting target component P, and the like. Component information includes the type and size of mounting target component P, the position of component supply device 21 for supplying mounting target component P (component supply position Fp), a supply angle (component supply angle Fθ) of component P that is supplied by component supply device 21 with respect to reference angle θ0 thereof, a position (mark position Fm) based on reference angle θ0 of a mark (a recognition section) affixed to an upper surface of component P, and the like. Management device 70 is connected to control device 60 of component mounting device 10 in such a manner as to communicate therewith so as to exchange various types of information and control signals.

Figure 5:
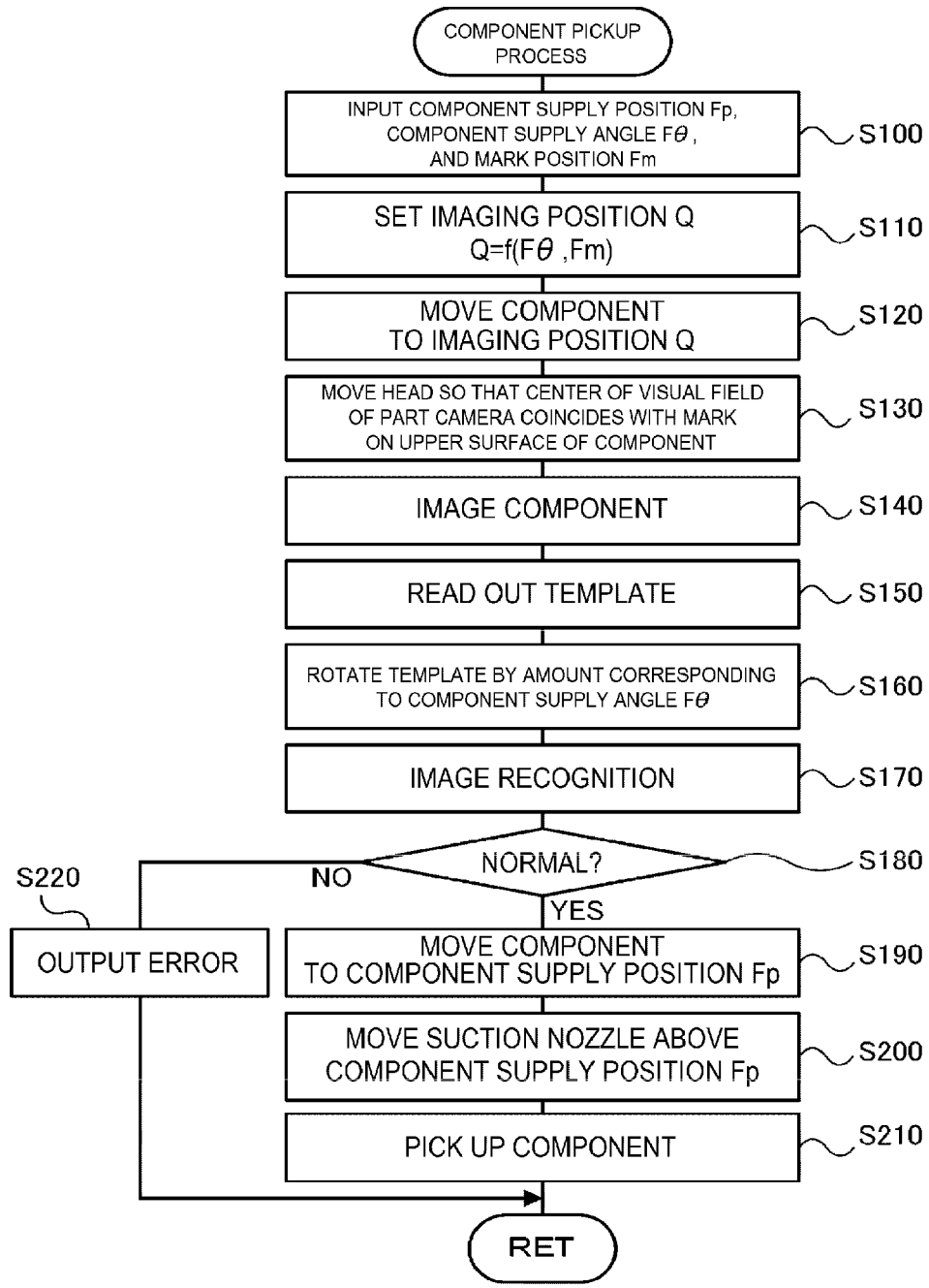
FIG. 5 is a flowchart showing an example of a component pickup process.

Next, an operation of component mounting device 10 configured as described heretofore will be described. There will be described, in particular, a pickup operation in which component P supplied by component supply device 21 (a tape feeder) is recognized through image recognition and is then picked up and a template creating operation in which a template for use for the image recognition is created. The pickup operation will first be described, and thereafter, the template creating operation will be described. FIG. 5 is a flowchart showing an example of a component pickup process that is executed by CPU 61 of control device 60. This process is executed when the job information from management device 70 is received and board S is conveyed in and fixed in place in component mounting device 10 by board conveyance device 22.

When the component pickup process is executed, CPU 61 of control device 60 first inputs component supply position Fp, component supply angle Fθ, and mark position Fm in the production information that is included in the job information received from management device 70 (step S100). Subsequently, CPU 61 sets imaging position Q based on component supply angle Fθ and mark position Fm that CPU 61 has inputted (step S110). Here, imaging position Q constitutes a position of component P that is suitable for causing light from external light source 50 fixed to the front inner wall of housing 12 to reach a mark (a recognition section) affixed to an upper surface of component P. Imaging position Q is set by obtaining in advance a relationship among component supply angle Fθ, mark position Fm, and imaging position Q, storing the relationship so obtained in ROM 62 as a map, and deriving corresponding imaging position Q from the map when component supply angle Fθ and mark position Fm are given. When imaging position Q is set, CPU 61 outputs a control signal to component supply device 21 so as to cause it to move component P to imaging position Q so set (step S120). Then, CPU 61 causes XY moving device 30 to move head 40 so that a center of a visual field of part camera 26 coincides with a center of the mark affixed to the upper surface of component P (step S130), causes external light source 50 to emit light, and causes part camera 26 to image the upper surface (the mark) of component P (step S140).

Figure 6:
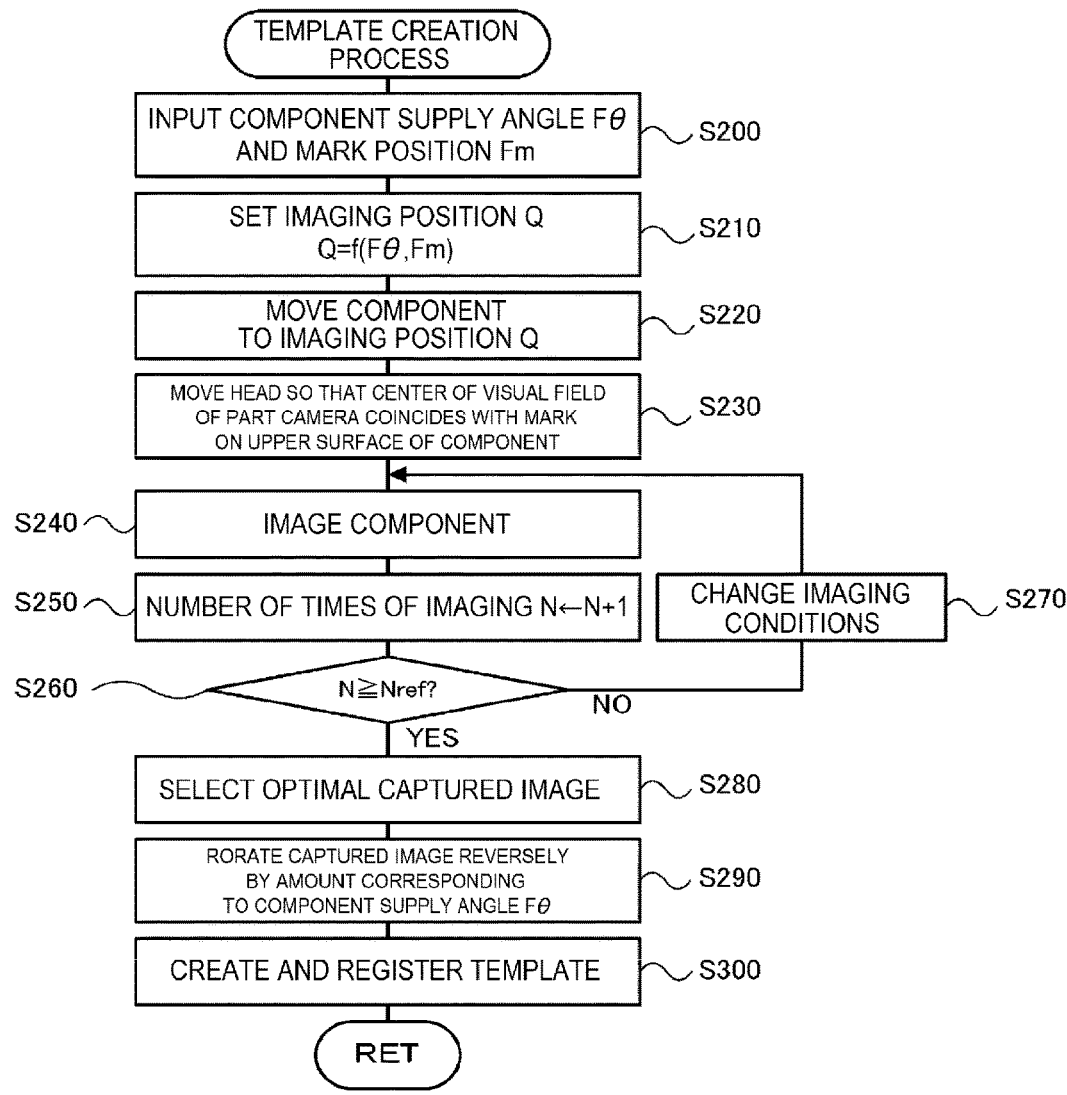
FIG. 6 is a flowchart showing an example of a template creation process.

Next, CPU 61 reads out a template from HDD 63 (step S150). Here, in the present embodiment, a template is intended to recognize component P captured in the captured image to thereby determine whether component P so captured is supplied in a correct orientation that matches component supply angle Fθ, and is created through a template creation process shown in FIG. 6. Hereinafter, the template creation process will be described by interrupting the description of the component pickup process.

In the template creation process, firstly, CPU 61 inputs component supply angle Fθ and mark position Fm in the production information received from management device 70 (step S200). Subsequently, CPU 61 sets imaging position Q based on component supply angle Fθ and mark position Fm that CPU 61 has inputted (step S210), outputs a control signal to component supply device 21, and causes component supply device 21 to move component P to imaging position Q so set (step S220). Then, CPU 61 causes XY moving device 30 to move head 40 so that the center of the visual field of part camera 26 matches a center of a mark affixed to an upper surface of component P (step S230), causes external light source 50 to emit light, and causes part camera 26 to image the upper surface (the mark) of that component P (step S240). That is, CPU 61 executes the same process operations as those in steps S100 to S140 in the component pickup process except that CPU 61 does not input component supply position Fp in step S200.

Next, CPU 61 increments number of times of imaging N by a value 1 (step S250), and determines whether number of times of imaging N is equal to or greater than predetermined number of times Nref (for example, five times) (step S260). If it determines that number of times of imaging N is smaller than predetermined number of times Nref, CPU 61 repeats process operations of changing imaging conditions (for example, a shutter speed, an amount of light emitted from external light source 50, or the like) (step S270), imaging the upper surface (the mark) of component P in imaging position Q (step S240), and incrementing number of times of imaging N by the value 1 (step S250).

Figure 7:
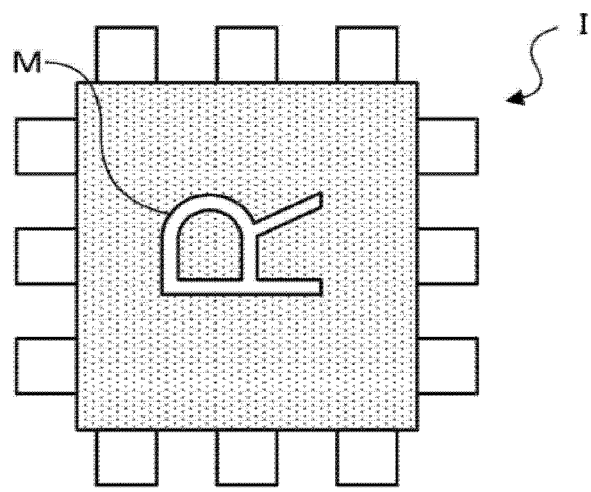
FIG. 7 is an explanatory diagram showing how to create a template.
Figure 7:
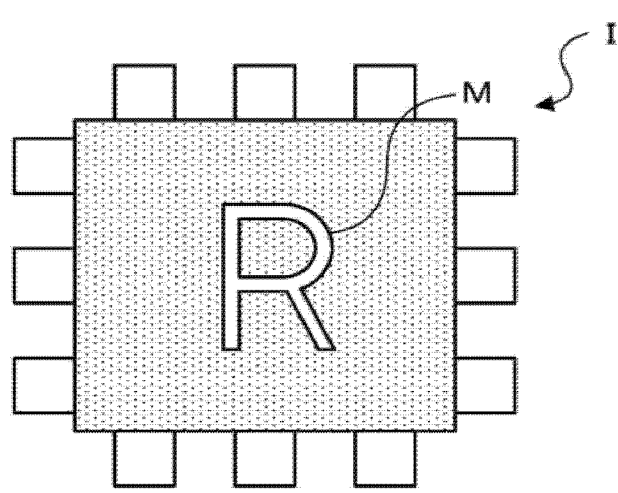
Figure 7:
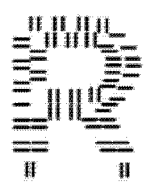

If it determines that number of times of imaging N is equal to or greater than predetermined number of times Nref in step S260, CPU 61 selects a captured image having a best image quality from multiple captured images obtained (step S280). Subsequently, CPU 61 rotates the captured image so selected in an opposite direction by an amount corresponding to component supply angle Fθ that CPU 61 inputs in step S200 so that component P captured in the selected captured image is oriented at reference angle 80 (step S290). Then, CPU 61 recognizes component P from the captured image so rotated, creates a template from component P so recognized, and registers the template so created in HDD 63 (step S300), whereupon CPU 61 ends the template creation process. FIG. 7 is an explanatory diagram showing how to create a template. An example shown in the explanatory diagram shows how to create a template for recognizing mark M affixed to an upper surface of component P. When it captures an image of component P supplied in such a state that component P is rotated 90 degrees counterclockwise from the reference angle (0 degree) (component supply angle Fθ is 90 degrees), CPU 61 rotates captured image I so obtained 90 degrees clockwise (refer to FIGS. 7(a), 7(b)). Then, CPU 61 sets seek lines around mark M that constitutes a recognition target (refer to Fig. see FIG. 7(c)), and registers an aggregate of seek lines so set as a template.

Returning to the component pickup process, when it reads out the template, CPU 61 rotates the template so read out by an amount corresponding to component supply angle Fθ that CPU 61 inputs in step S100 (step S160). Subsequently, CPU 61 performs a recognition process for recognizing mark M which constitutes a recognition target object in the captured images obtained in step S140 using the template obtained in step S160 (step S170). Then, CPU 61 determines whether the supply angle of component P supplied from component supply device 21 matches component supply angle Fθ that CPU 61 inputs in step S100, that is, whether the supply angle of component P is normal, based on a determination of whether mark M in question has been recognized using the template (step S180). When it determines that the supply angle of component P is normal, CPU 61 outputs a control signal to component supply device 21 so as to cause component supply device 21 to move component P to component supply position Fp (step S190). Subsequently, CPU 61 causes XY moving device 30 to move head 40 so that suction nozzle 41 is located above component supply position Fp (step S200). Then, CPU 61 causes Z-axis motor 42 to bring suction nozzle 41 into abutment with an upper surface of component P that is supplied to component supply position Fp and causes a negative pressure to be supplied to suction nozzle 41 so as for suction nozzle 41 to pick up component P in component supply position Fp (step S210), whereupon CPU 61 ends the component pickup process. When it has caused suction nozzle 41 to so pick up component P, CPU 61 shifts to a component mounting process (not shown).

In the component mounting process, CPU 61 first causes XY moving device 30 to move head 40 so that component P that suction nozzle 41 holds is moved to be located above part camera 26 and then causes part camera 26 to image component P located thereabove. Subsequently, CPU 61 processes a captured image so obtained to thereby calculate a positional deviation amount of a pickup position where component P is picked up and corrects target mounting position Mp where component P is mounted onto board S based on the positional deviation amount so calculated. Next, CPU 61 causes XY moving device 30 to move head 40 so that component P that suction nozzle 41 holds is moved to be located above target mounting position Mp. Then, CPU 61 causes Z-axis motor 42 to bring suction nozzle 41 into abutment with a front surface of board S and then causes a positive pressure to be supplied to suction nozzle 41 to thereby cause suction nozzle 41 to mount component P onto board S.

If it determines in step S180 that the supply angle of component P does not match component supply angle Fθ that CPU 61 inputs in step S100 and hence that the supply angle is not normal, CPU 61 outputs an error (step S220), and ends the component mounting process without performing the component pickup process for component P.

Here, there will be described corresponding relationships between the principal elements of the present embodiment and principal elements of the present disclosure which will be described in claims below. That is, component supply device 21 (the tape feeder) corresponds to a component supply device, head 40 corresponds to a head, mark camera 25 corresponds to an imaging device, and control device 60 corresponds to a control device. In addition, external light source 50 corresponds to an external light source. Then, XY moving device 30 corresponds to a moving device.

Needless to say, the present disclosure is not limited to the embodiment that has been described heretofore in any way and may be implemented in various forms without departing from the technical scope of the present disclosure.

For example, in the embodiment that has been described heretofore, CPU 61 is described as preparing the template (the recognition data) for recognizing mark M affixed to the upper surface of component P. However, CPU 61 may be configured to create a template for recognizing an external shape of component P.

In the embodiment described heretofore, CPU 61 is described as using the template to determine whether the supply orientation of the component supplied from component supply device 21 is normal. However, CPU 61 may use the template to recognize the supply position of the component supplied from component supply device 21.

In the embodiment described above, in the template creation process, CPU 61 images the target component multiple times and selects a captured image having the best image quality from the multiple captured images so obtained. However, CPU 61 may image the target component multiple times and synthesize the multiple captured images so obtained so as to create a single captured image. In addition, CPU 61 may perform an imaging operation on the target component only once.

Additionally, in the embodiment described above, in the component pickup process, CPU 61 is described as causing component P to be moved to imaging position Q to be imaged and thereafter causing component P to be moved to component supply position Fp to be picked up by suction nozzle 41. However, imaging position Q may be the same position as component supply position Fp. In this case, in the component pickup process, CPU 61 may cause component P to be moved to component supply position Fph to be imaged and thereafter causing suction nozzle 41 to pick up component P so imaged in component supply position Fph.

As has been described heretofore, according to the gist of the component mounting device of the present disclosure, there is provided a component mounting device for picking up a component supplied from a component supply device and mounting the component so picked up onto a target object, including a head configured to pick up the component, an imaging device configured to image the component supplied from the component supply device, and a control device configured to execute a recognition data creation process for preparing the recognition data by obtaining angle information on a supply angle of the component supplied from the component supply device with respect to a reference angle thereof, causing the imaging device to operate so as to image the component supplied from the component supply device, and rotating a captured image so obtained to the reference angle based on the angle information, and a pickup process for causing the head to operate so as to pick up the component after a supply state of the component is determined based on the captured image obtained by causing the imaging device to operate so as to image the component supplied from the component supply device, the recognition data created in the recognition data creation process, and the angle information.

The component mounting device of the present disclosure includes the control device configured to execute the recognition data creation process and the pickup process. In the recognition data creation process, the control device creates the recognition data by obtaining the angle information of the component, causing the imaging device to operate so as to image the component, and rotating the captured image so obtained to the reference angle based on the angle information. In the pickup process, the control device causes the head to operate so as to pick up the component after the supply state of the component is determined based on the captured image obtained by causing the imaging device to operate so as to image the component, the recognition data created in the recognition data creation process, and the angle information. In this way, the component mounting device can create the recognition data by sharing the part of the process executed in the recognition data creation process with the pickup process. As a result, with the component mounting device, the recognition data for determining on the supply state of the component supplied from the component supply device can be created through the simple process. The component supply device includes, for example, a tape feeder.

In the component mounting device of the present disclosure that is configured as described above, a configuration may be adopted in which the component mounting device includes an external light source configured to illuminate light towards a predetermined position, and when a component having an identification section on an upper surface thereof is supplied from the component supply device so as for the component so supplied to be picked up, the control device creates, as the recognition data creation process, the recognition data by setting an imaging position near the predetermined position based on the angle information, causing the component supply device to operate so as to move the component to the imaging position, causing the imaging device to operate so as to image the upper surface of the component moved to the imaging position, and rotating a captured image so obtained to the reference angle based on the angle information, and causes, as the pickup process, the head to operate so as to pick up the component moved to a pickup position by setting an imaging position near the predetermined position based on the angle information, causing the component supply device to operate so as to move the component to the imaging position, causing the imaging device to operate so as to image the upper surface of the component moved to the imaging position, determining a supply state of the component based on a captured image so obtained, the recognition data, and the angle information, and causing the component supply device to operate so as to move the component from the imaging position to the pickup position. As a result, the component can be imaged in such a state that light from the external light source is allowed to reach the recognition section on the upper surface of the component irrespective of the supply angle of the component, whereby the recognition data creation process and the pickup process can be performed more appropriately.

In addition, in the component mounting device of the present disclosure, a configuration may be adopted in which the component mounting device includes a moving device configured to move the head, the imaging device can be moved together with the head by the moving device, and when a component having an identification section on an upper surface thereof is supplied from the component supply device so as for the component so supplied to be picked up, in executing the recognition data creation process and the pickup process, the control device causes the moving device to operate so as to allow the identification section to fall within a predetermined visual field of the imaging device and causes the imaging device to operate so as to image the identification section. As a result, the recognition section can be imaged more appropriately.

Further, in the component mounting device of the present disclosure, a configuration may be adopted in which the control device creates, as the recognition data creation process, the recognition data by causing the imaging device to operate so as to image the component multiple times under different imaging conditions and rotating a single image obtained from multiple captured images so obtained to the reference angle based on the angle information. As a result, the recognition data can be created with a higher precision, whereby the occurrence of a recognition error can be suppressed.

INDUSTRIAL APPLICABILITY

The present disclosure can be applied to a manufacturing industry of component mounting devices, and the like.

REFERENCE SIGNS LIST

10 component mounting device, 11 base, 12 housing, 21 component supply device, 22 board conveyance device, 25 mark camera, 26 part camera, 30 XY moving device, 31 X-axis guide rail, 32 X-axis slider, 33 X-axis motor, 35 Y-axis guide rail, 36 Y-axis slider, 37 Y-axis motor, 40 head, 41 suction nozzle, 42 Z-axis motor, 43 θ-axis motor, 50 external light source, 60 control device, 61 CPU, 62 ROM, 63 HDD, 64 RAM, 65 input and output interface, 66 bus, 70 management device, 71 CPU, 72 ROM, 73 HDD, 74 RAM, 75 input and output interface, 76 bus, 77 input device, 78 display, T tape, P component, Fp component supply position, I imaging device, M mark.

The invention claimed is:

1. A component mounting device for picking up a component supplied from a component supply device and mounting the component so picked up onto a target object, comprising:
  a head configured to pick up the component;
  an imaging device configured to image components supplied from the component supply device; and
  a control device configured to execute a recognition data creation process for preparing template recognition data in advance for inspection of a supply state of the component supplied from the component supply device by obtaining angle information on a supply angle of components supplied from the component supply device with respect to a reference angle thereof, causing the imaging device to operate so as to image a template component supplied from the component supply device, and rotating a captured image so obtained by an angle corresponding to the supply angle of the component supplied from the component supply device to the reference angle based on the angle information to create the template recognition data, and a pickup process for causing the head to operate so as to pick up the component after the supply state of the component is determined by causing the imaging device to operate so as to image the component supplied from the component supply device, rotating the template recognition data by an angle corresponding to the supply angle of the component supplied from the component supply device in a direction opposite to the rotation for creating the template recognition data, and determining the supply state of the component based on whether a supply angle of the component matches the angle information based on the captured image of the component and the rotated template recognition data.

2. The component mounting device according to claim 1, comprising:
  an external light source configured to illuminate light towards a predetermined position,
  wherein when the component is a component having an identification section on an upper surface thereof, the control device creates, as the recognition data creation process, the template recognition data by setting an imaging position near the predetermined position based on the angle information, causing the component supply device to operate so as to move the template component to the imaging position, causing the imaging device to operate so as to image the upper surface of the template component moved to the imaging position, and rotating a captured image so obtained to the reference angle based on the angle information to create the template recognition data, and causes, as the pickup process, the head to operate so as to pick up the component moved to a pickup position by setting an imaging position near the predetermined position based on the angle information, causing the component supply device to operate so as to move the component to the imaging position, causing the imaging device to operate so as to image the upper surface of the component moved to the imaging position, determining a supply state of the component based on a captured image so obtained, the template recognition data, and the angle information, and causing the component supply device to operate so as to move the component from the imaging position to the pickup position.

3. The component mounting device according to claim 1, comprising:

a moving device configured to move the head, wherein the imaging device can be moved together with the head by the moving device, and wherein when the component is a component having an identification section on an upper surface thereof, in executing the recognition data creation process and the pickup process, the control device causes the moving device to operate so as to allow the identification section to fall within a predetermined visual field of the imaging device and causes the imaging device to operate so as to image the identification section.

4. The component mounting device according to claim 1, wherein the control device creates, as the recognition data creation process, the template recognition data by causing the imaging device to operate so as to image the template component multiple times under different imaging conditions and rotating a single image obtained from multiple captured images so obtained to the reference angle based on the angle information.

5. The component mounting device according to claim 1, wherein the component supply device is a tape feeder.

* * * * *